United States Patent [19]
Hisada et al.

[11] Patent Number: 5,654,935
[45] Date of Patent: Aug. 5, 1997

[54] SEMICONDUCTOR MEMORY

[75] Inventors: Toshiki Hisada; Hiroyuki Koinuma, both of Yokohama, Japan

[73] Assignee: Kabushiki Kaisha Toshiba, Tokyo, Japan

[21] Appl. No.: 528,700

[22] Filed: Sep. 15, 1995

[30] Foreign Application Priority Data

Sep. 30, 1994 [JP] Japan .................................. 6-236982

[51] Int. Cl.$^6$ ...................................................... G11C 8/00
[52] U.S. Cl. ...................... 365/233.5; 365/189.11
[58] Field of Search ...................... 326/98, 24; 365/194, 365/233.5, 189.11

[56] References Cited

U.S. PATENT DOCUMENTS 5,047,984  9/1991  Monden ..............................: 365/233.5

*Primary Examiner*—David C. Nelms
*Assistant Examiner*—Michael T. Tran
*Attorney, Agent, or Firm*—Loeb & Loeb LLP

[57] ABSTRACT

A semiconductor memory includes a plurality of memory cells aligned in rows and columns, a plurality of bit lines respectively connected to the columns of the plurality of memory cells, a plurality of switch circuits each having one end connected to a corresponding one of the plurality of bit lines, the plurality of switch circuits being selectively turned on in accordance with a column address signal input from an outside to identify each of the columns, a data line to which the other end of each of the plurality of switch circuits is commonly connected, a pulse generation circuit for detecting a change in level of the column address signal with respect to first and second circuit thresholds different from each other to generate a pulse signal, the first circuit threshold being used for detecting a change in address signal from one level to the other level, and the second circuit threshold being used for detecting a change in address signal from the other level to one level, and a data detection circuit, connected to the data line and controlled by the pulse signal generated in accordance with the pulse generation circuits, for amplifying a potential of the data line to detect data.

15 Claims, 11 Drawing Sheets

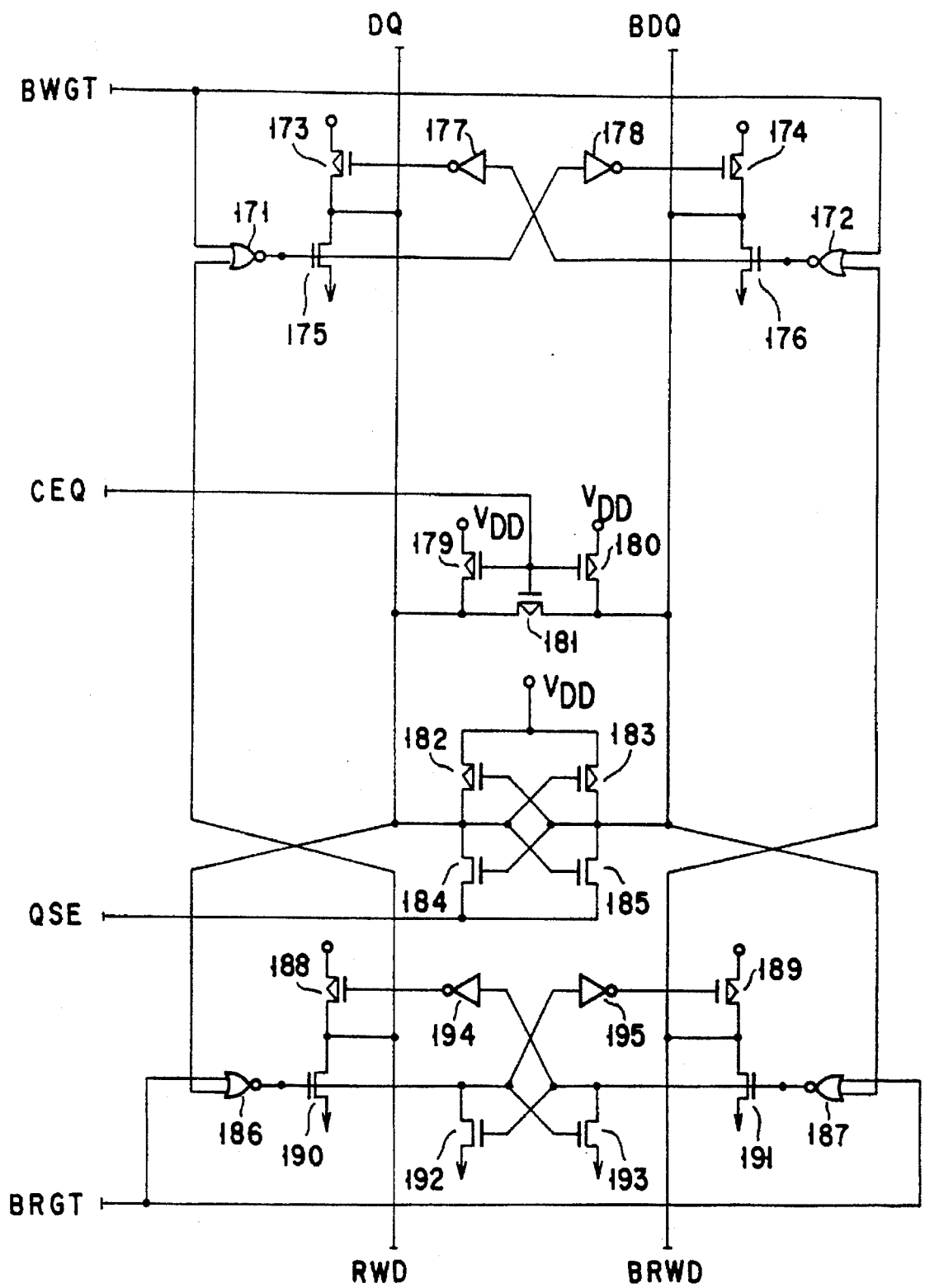
F I G. 9

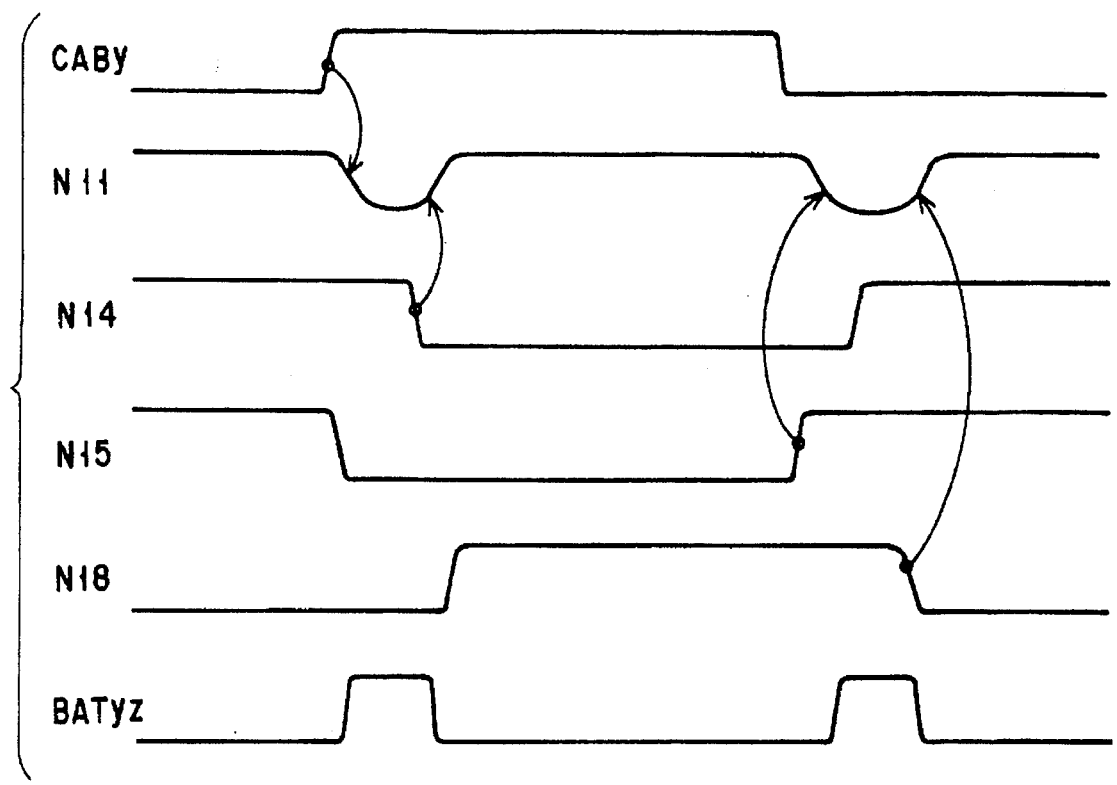
F I G. 13

SEMICONDUCTOR MEMORY

BACKGROUND OF THE INVENTION

1. Field of the Invention

The present invention relates to a semiconductor memory and, more particularly, to a dynamic semiconductor memory comprising a control circuit with which cell data is not destroyed by a malfunction.

2. Description of the Related Art

With advances in the integration circuit technique, semiconductor memory devices, and particularly dynamic random access memories (DRAMs; to be referred to as DRAMs hereinafter) have been widely used in the field of electronics. Large-capacity DRAMs are used in a field requiring a very large memory capacity, e.g., the field of image memories. In this field, stored data must be sequentially read out at high speed.

Operation modes such as a fast page mode and an extended data output mode (EDO) are devised and used in correspondence with this high-speed read system.

FIG. 1 shows the basic arrangement of a DRAM of this high-speed read system. As for the flow of signals, a column address input and a row address input are time-divisionally input to and latched by a column address buffer 1 and a row address buffer 2 in synchronization with selection signals (not shown). A row decoder 3 selectively drives a word line to access the row of a desired memory cell in a memory cell array 10.

Information in the memory cell on the accessed row is transferred to a bit line (not shown) and amplified by a sense amplifier 8. At the same time, information is rewritten in this memory cell.

A column decoder 4 selectively drives a selection gate 7 in accordance with the column address input and selects an output from the sense amplifier 8 corresponding to a desired column. This selected information is read out to a data line (not shown) and transferred to an I/O buffer 9 through a data buffer 6. The I/O buffer 9 is connected to an I/O portion (not shown).

Upon a change in the column address input signal, an address transition detector 5 generates a data line equalization signal and sends a sense signal to the data buffer 6.

To prevent destruction of memory cell information, the series of operations are controlled in accordance with an internal synchronization signal and executed in a predetermined order at predetermined timings.

In such a DRAM, noise generation in the column address buffer 1 greatly increases the possibility of causing a malfunction. Assume that the column decoder 4 selects a column different from the currently selected column due to the noise. In the address transition detector 5, however, noise generally tends to be suppressed due to the internal characteristics of this circuit, so that an output from the address transition detector 5 is not switched with the noise. For this reason, no equalization operation for a data line or data sense operation is performed. Therefore, the data on this data line may flow into the newly switched column (bit line) to destroy data.

SUMMARY OF THE INVENTION

It is an object of the present invention to provide a semiconductor memory having high reliability, because cell data is not destroyed when noise is generated in a column input buffer.

To achieve the above object, according to the present invention, a semiconductor memory comprises:

a plurality of memory cells arranged in rows and columns;

a plurality of bit lines connected to the plurality of memory cells in a direction of the columns, respectively;

a plurality of switch means each having one end connected to a corresponding one of the plurality of bit lines, the plurality of switch means being selectively turned on in accordance with a column address signal input from an outside to designate each of the columns;

a data line to which the other end of each of the plurality of switch means is commonly connected;

pulse generation means for detecting a change in level of the column address signal with respect to first and second circuit thresholds different from each other to generate a pulse signal, the first circuit threshold being used for detecting a change in address signal from one level to the other level, and the second circuit threshold being used for detecting a change in address signal from the other level to one level; and data detection means, connected to the data line and controlled in accordance with the pulse signal generated by the pulse generation means, for amplifying a potential of the data line to detect data.

Further, the pulse generation means comprises:

a first delay circuit for delaying the address signal to output a signal having a level complementary to the address signal;

a first gate circuit connected between a line of a power supply potential and a reference potential line, the first gate circuit including a p-channel MOS transistor having a first drain region connected to the line of the power supply potential, a first source region connected to a first output terminal, and a first gate electrode to which an active signal is always supplied, a first n-channel MOS transistor having a second drain region connected to the first output terminal, a second source region, and a second gate electrode to which the column address signal is supplied, and a second n-channel MOS transistor having a third drain region connected to the second source region of the first n-channel MOS transistor, a third source region connected to the reference potential line, and a third gate electrode to which an output is supplied from the first delay circuit;

a first inversion circuit, having a circuit threshold lower than a circuit threshold of the first gate circuit, for receiving the column address signal to invert the column address signal;

a second delay circuit for delaying an output signal from the first inversion circuit to output a signal having a level complementary to the output signal from the first inversion circuit; and a second gate circuit connected between the first output terminal and the reference potential line, the second gate circuit including a third n-channel MOS transistor having a fourth drain region connected to the first output terminal, a fourth source region, and a fourth gate electrode to which the output signal is supplied from the first inversion circuit, and a fourth n-channel MOS transistor having a fifth drain region connected to the fourth source region of the third n-channel MOS transistor, a fifth source region connected to the reference potential line, and a fifth gate electrode to which an output signal is supplied from the second delay circuit.

The semiconductor memory preferably further comprises a waveform shaping circuit (second inversion circuit) connected to the first output terminal.

More specifically, with the above arrangement, when the switch means connected between the bit lines and the data line are switched with noise, the pulse generation means generates the pulse signal on the basis of this noise to operate the data detection means for detecting data, thereby amplifying the potential of the data line. Therefore, destruction of memory cell data can be prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 9 is a circuit diagram showing a data buffer (DQBF) according to the embodiment of the present invention;

FIG. 13 is a timing chart for explaining a normal operation when noise is not generated in the column input buffer in the DRAM of the present invention;

DETAILED DESCRIPTION OF THE PREFERRED EMBODIMENTS

A preferred embodiment of the present invention will be described below with reference to the accompanying drawings.

Figure 1:
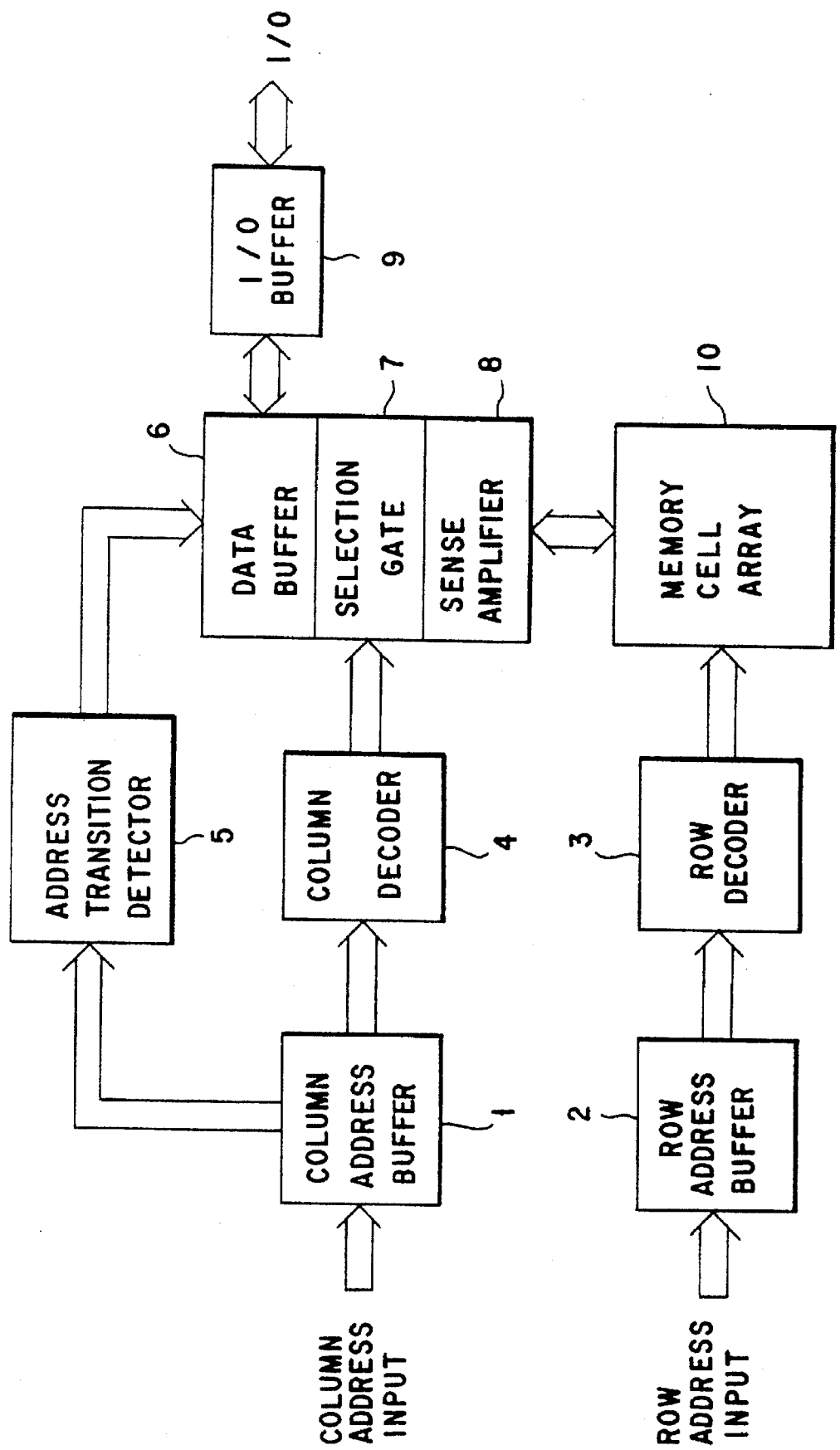
FIG. 1 is a block diagram showing the flow of signals in a general DRAM.
Figure 2:
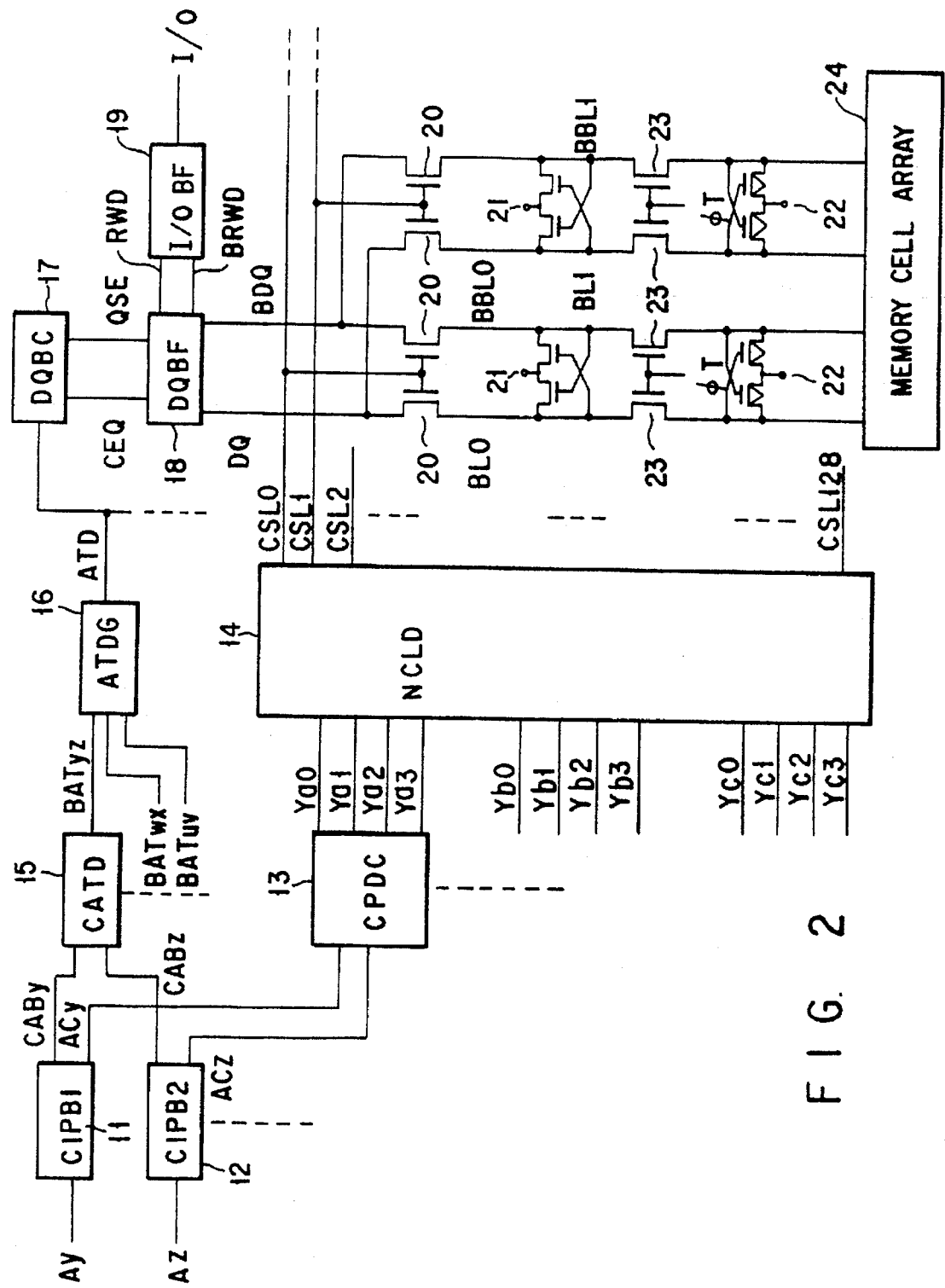
FIG. 2 is a block diagram showing the circuit arrangement of a DRAM column system according to an embodiment of the present invention.

FIG. 2 is a block diagram showing the circuit arrangement of a DRAM column system of the present invention. Upon reception of an external address signal (column address signal) Ay, a column input buffer (CIPB1) 11 outputs internal address signals ACy and CABy. Similarly, upon reception of an external address signal (column address signal) Az, a column input buffer (CIPB2) 12 outputs internal address signals ACz and CABz. Such input buffers are arranged in correspondence with a plurality of column address signals.

The internal address signals ACy and ACz respectively output from the column input buffers 11 and 12 are input to a column partial decoder (CPDC) 13. This column partial decoder 13 decodes the two signals to output four types of decode signals Ya0 to Ya3. A column decoder (NCLD) 14 receives the decode signals Ya0 to Ya3 output from the column partial decoder 13, and decode signals Yb0 to Yb3 and Yc0 to Yc3 generated by other column partial decoders from external address signals (not shown) except for the above external address signals Ay and Az. This column decoder 14 outputs selection signals to column selection lines CSL0 to CSL128 on the basis of these decode signals.

The internal address signals CABy and CABz respectively output from the column input buffers 11 and 12 are input to a column address transition detector (CATD; to be referred to as a CATD circuit hereinafter) 15. Although one CATD circuit corresponds to two column input buffers in this embodiment, the number is not limited to this, and one CATD circuit may correspond to three or four column input buffers or one column input buffer. This CATD circuit 15 outputs a pulse signal BATyz when at least any one of the two signals to be input changes in level.

An address transition detector generator (ATDG; to be referred to as an ATDG circuit hereinafter) 16 receives the pulse signal BATyz output from this CATD circuit 15, and pulse signals BATwx and BATuv generated by other CATD circuits from external address signals (not shown) except for the above external address signals Ay and Az. This ATDG circuit 16 outputs a pulse signal ATD having a predetermined pulse width on the basis of these pulse signals.

The pulse signal ATD output from the ATDG circuit 16 is input to a plurality of data buffer control circuits (DQBCs; to be referred to as DQBC circuits) 17 arranged in correspondence with groups each having a predetermined number of columns. These DQBC circuits 17 are selectively activated in accordance with a row address signal to output data line equalization signals CEQ and data line sense signals QSE on the basis of the pulse signal ATD.

The data line equalization signal CEQ and the data line sense signal QSE output from each DQBC circuit 17 are input to a data buffer (DQBF) 18. This data buffer 18 performs an equalization operation for a pair of data lines DQ and BDQ (BDQ means to have an inversion relationship with DQ hereinafter) on the basis of the data line equalization signal CEQ, and a data sense (amplification of a potential difference) operation on the pair of data lines DQ and BDQ on the basis of the data line sense signal QSE.

An input/output buffer (I/O BF) 19 is connected to the data buffer 18 through read/write data lines RWD/BRWD. In data access, read/write data are exchanged between the data buffer 18 and the input/output buffer 19.

A plurality of dynamic memory cells (not shown), which are included in a memory cell array 24, are connected to a plurality of pairs of bit lines (this embodiment shows only two pairs of bit lines BL0 and BBL0, and BL1 and BBL1). DQ gates 20 are inserted between the pair of bit lines BL0 and BBL0 and the data lines DQ and BDQ and between the pair of bit lines BL1 and BBL1 and the data lines DQ and BDQ, respectively. One DQ gate 20 is constituted by a pair of n-channel MOS transistors having gates respectively connected to the column selection line CSL0 or CSL1.

An n-channel-side bit line sense amplifier 21 constituted by cross-coupling two n-channel MOS transistors is connected between each pair of bit lines. Similarly, a restoring p-channel-side bit line sense amplifier 22 constituted by cross-coupling two p-channel MOS transistors is connected in between each pair of bit lines.

φT gates 23 are arranged midway along each pair of bit lines so as to separate the n-channel-side bit line sense amplifier 21 from the p-channel-side bit line sense amplifier 22. Each φT gate 23 is constituted by an n-channel MOS transistor having a gate which always receives a signal φT set at a power supply potential VDD.

In a DRAM having such an arrangement, when a combination of the column address signal and the row address signal is input, the column decoder 14 selects any one column selection line CSLi (i=0 to 128). One DQ gate 20 having a pair of gates connected to this selected column selection line CSLi is turned on to connect any one of pairs of bit lines to the data lines DQ and BDQ. At this time, a plurality of memory cells connected to one word line (not shown) are simultaneously selected in accordance with the row address signal and connected to corresponding bit lines.

On the other hand, with a change in column address signal, the ATDG circuit 16 outputs the pulse signal ATD. The pulse signal ATD is input to one DQBC circuit 17 activated in accordance with the row address signal to output the data line equalization signal CEQ and the data line sense signal QSE to the data buffer 18. The data buffer 18 performs an equalization operation for the data lines DQ and BDQ on the basis of the data line equalization signal CEQ prior to data read access to the selected memory cells. On the basis of the data line sense signal QSE, the data buffer 18 then amplifies a potential difference between the pair of bit lines to which a read potential is supplied from the selected memory cells. Data amplified by the data buffer 18 is output to the outside (I/O) through the input/output buffer 19.

Figure 3:
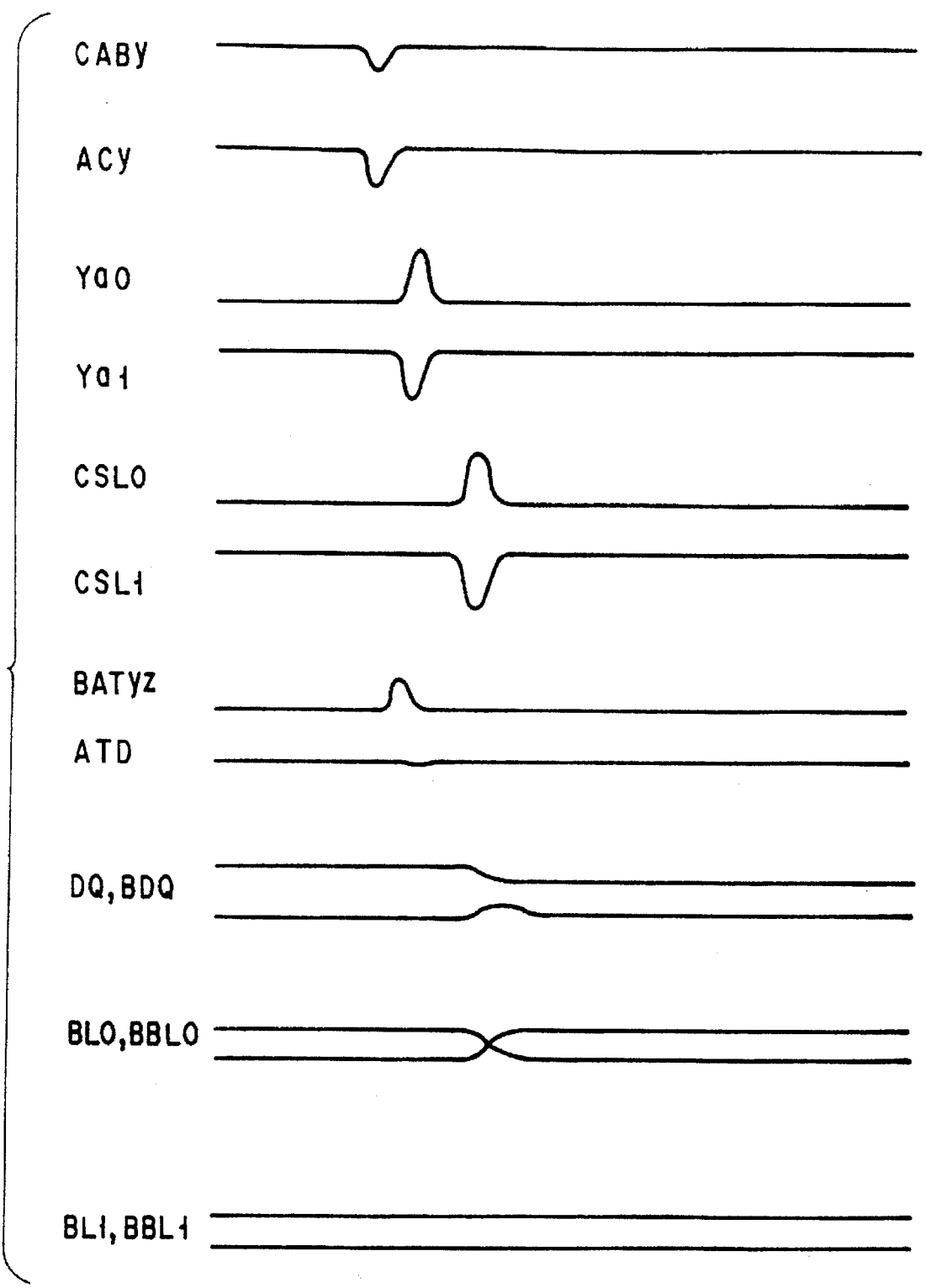
FIG. 3 is a timing chart for explaining a phenomenon caused when a malfunction occurs in a conventional circuit.

In a conventional DRAM having the above-mentioned address transition circuit, noise generation in a column input buffer will cause a high possibility of malfunction. FIG. 3 is a timing chart for explaining a conventional phenomenon caused when noise is generated in, e.g., the column input buffer 11, and "L" noise is mixed in the internal address signals CABy and ACy both in an "H" state. Assume that, upon reception of noise of the signal ACy, the decode signal Ya0 of the column partial decoder 13 rises, and the decode signal Ya1 falls. At this time, upon reception of changes in levels of the decode signals Ya0 and Ya1, the column selection line CSL0, which has been in an "L" non-selection state, becomes "H" in a pulse form. To the contrary, the column selection line CSL1, which has been in an "H" selection state, becomes "L" in a pulse form. By setting the column selection line CSL1 "L", the column selection line CSL1 is connected to the pair of bit lines BL1 and BBL1 to temporarily turn off the DQ gate 20, which has been turned on. To the contrary, by setting the column selection line CSL0 "H", the column selection line CSL0 is connected to the pair of bit lines BL0 and BBL0 to temporarily turn on the DQ gate 20, which has been turned off.

On the other hand, on the path of a conventional address transition circuit from a column input buffer to an ATDG circuit, noise generally tends to be suppressed due to the internal characteristics of a circuit, and no pulse signal ATD is output from the address transition circuit. Assuming that such a state occurs, the DQBC circuit 17 and the data buffer 18 do not operate with the above noise to perform an equalization operation for the data lines DQ and BDQ and a data sense operation.

The data lines DQ and BDQ, which have been connected to the pair of bit lines BL1 and BBL1 before the above noise generation, are connected to the pair of bit lines BL0 and BBL0 after switching of the column selection lines in accordance with the noise. Assume that the pair of bit likes BL1 and BBL1 have a potential relationship reverse to that of the pair of bit lines BL0 and BBL0. When the pair of bit lines BL0 and BBL0 is connected to the data lines DQ and BDQ in accordance with noise, the DQBC circuit 17 and the data buffer 18 do not operate so that an equalization operation for the data lines DQ and BDQ and a data sense operation are not performed. Therefore, the data lines DQ and BDQ maintain a potential relationship corresponding to the potential of the pair of bit lines BL1 and BBL1, which was formerly connected to the data lines DQ and BDQ.

Generally, a capacitance parasitic in each of the data lines DQ and BDQ is larger than that in each of the pair of bit lines. For this reason, when the pair of bit lines BL0 and BBL0 are connected to the data lines DQ and BDQ, electrical charges flow from an "H" line of the pair of the bit lines DQ and BDQ into an "L" line of the pair of the bit lines BL0 and BBL0, and also flow from an "H" line of the pair of the bit lines BL0 and BBL0 into an "L" line of the pair of the data lines DQ and BDQ. As a result, the potential relationship of the pair of the bit lines BL0 and BBL0 is reversed.

Thereafter, on the pair of the bit lines BL0 and BBL0, the n-channel-side bit line sense amplifier 21 and the p-channel-side bit line sense amplifier 22 operate to perform an actual data write operation. Cell data of memory cells in a selected state which are connected to the pair of the bit lines BL0 and BBL0 are destroyed.

In this manner, the conventional DRAM suffers the problem that when noise is generated, and a column decoder is operated to switch column selection lines, cell data is destroyed because a data buffer control circuit and a data buffer are not operated with this noise.

The DRAM of the present invention has its characteristic feature on the arrangement of an address transition circuit system (particularly CATD circuit), and is constructed to avoid the above disadvantage. Prior to a detailed description of the CATD circuit, peripheral circuits described in the block diagram of FIG. 2 will be briefly explained.

Figure 4:
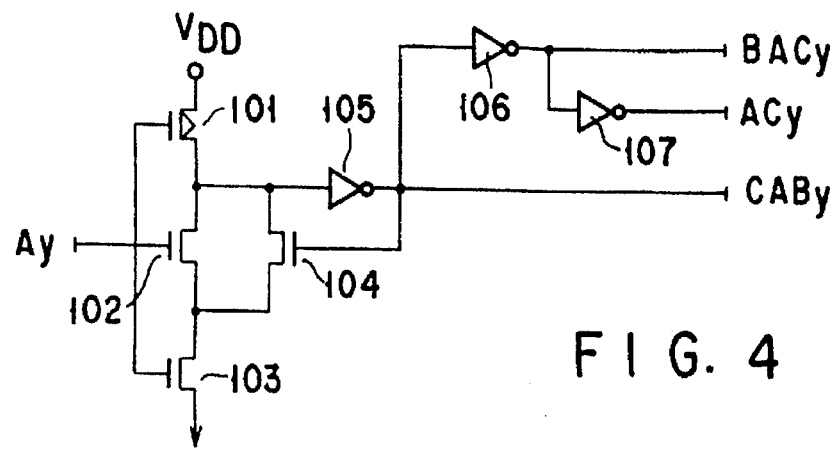
FIG. 4 is a circuit diagram showing a column input buffer (CIPB) according to the embodiment of the present invention.

FIG. 4 shows a circuit arrangement of the column input buffer (CIPB) 11. The CIPB is constituted by a Schmitt trigger circuit comprising a p-channel MOS transistor 101, n-channel MOS transistors 102 to 104, and an inverter 105, and inverters 106 and 107. When the column address signal Ay is activated, the internal address signals ACy and CABy at in-phase level are activated. Although not shown in FIG. 2, a signal BACy as an inverted signal of the signal ACy is input to the next CPDC 13 and used for generating the decode signals Ya0 to Ya3.

Figure 5:
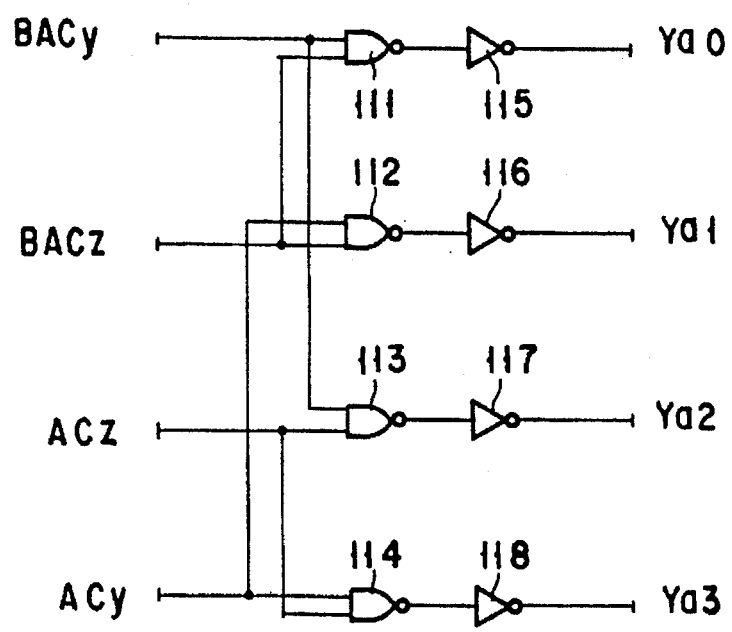
FIG. 5 is a circuit diagram showing a column partial decoder (CPDC) according to the embodiment of the present invention.

FIG. 5 shows a circuit arrangement of the column partial decoder (CPDC) 13. The internal address signals ACy, ACz, and BACy, and an internal address signal BACz, which are output from the CIPB circuits 11 and 12, are input to the decoder constituted by NAND gates 111 to 114. Calculated outputs are output as the decode signals Ya0 to Ya3 through inverters 115 to 118.

Figure 6:
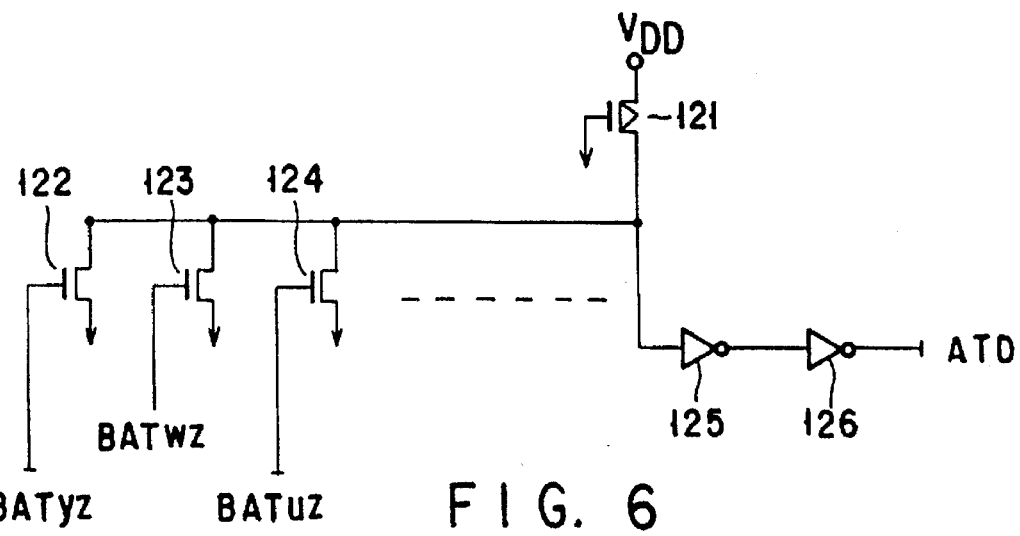
FIG. 6 is a circuit diagram showing an address transition detector generator (ATDG) according to the embodiment of the present invention.

FIG. 6 shows a circuit arrangement of the address transition detector (ATDG) 16. The pulse signals BATyz and BATwz and a pulse signal BATuz, . . . , which are output from the CATD circuit (to be described later), are input to an OR circuit constituted by a p-channel MOS transistor 121 and n-channel MOS transistors 122 to 124, . . . to output the ATD signal through inverters 125 and 126. The ATD signal is normally at "H" level. When any one of the BAT signals is activated, the ATD signal is activated at "L" level.

Figure 7:
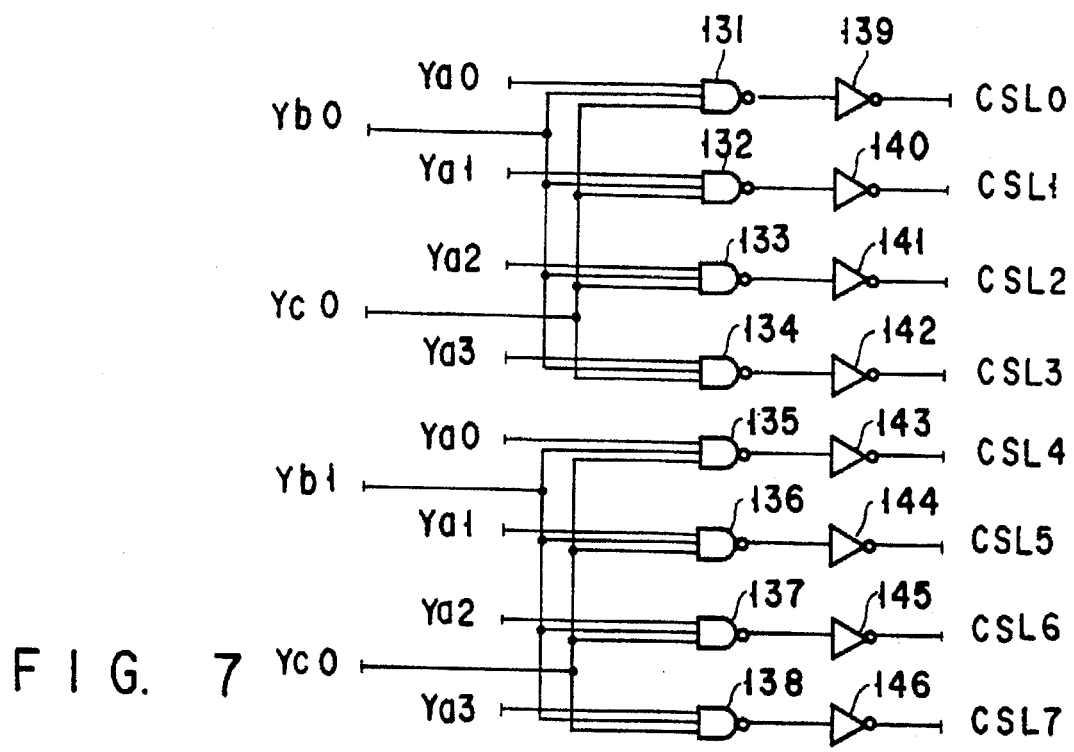
FIG. 7 is a circuit diagram showing a column decoder (NCLD) according to the embodiment of the present invention.

FIG. 7 shows a circuit arrangement of the column decoder 14. The decode signals Ya0 to Ya3, Yb0, Yb1, Yc0, and Yc1 are input to the decoder constituted by NAND gates 131 to 138. Calculated results are output as the column selection signal CSL0 and column selection signals CSL1 to CSL7 through inverters 139 to 146.

Figure 8:
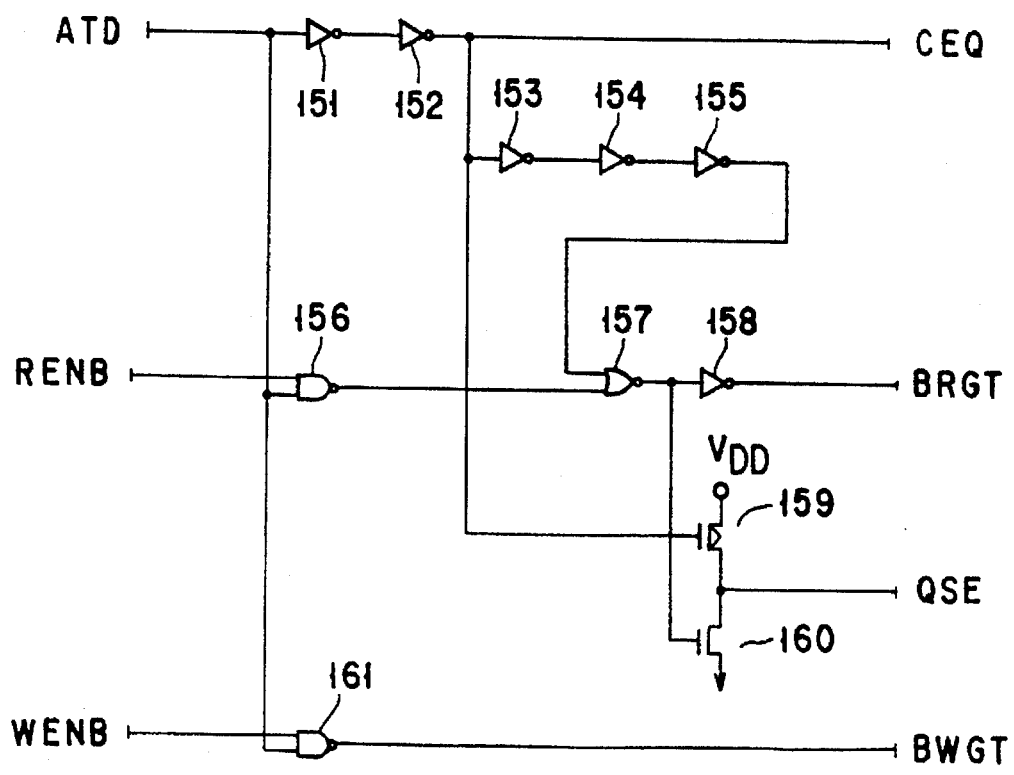
FIG. 8 is a circuit diagram showing a data buffer control circuit (DQBC) according to the embodiment of the present invention.

FIG. 8 shows a circuit arrangement of the data buffer control circuit 17. The ATD signal output from the ATDG 16 is output through inverters 151 and 152 as the data line equalization signal CEQ at in-phase level as that of the ATD signal. The CEQ signal is activated in synchronization with the trailing edge of the ATD signal.

The ATD signal is input to a NAND gate 156 together with a read enable signal RENB, and its output is input to a NOR gate 157 together with an inverted signal obtained by inverting and delaying the CEQ signal by inverters 153 to 155. An output from the NOR gate 157 is output as a BRGT signal through an inverter 158. This BRGT signal is supplied to the data buffer 18. The RENB signal is a signal which goes to "H" level in read access. When the ATD signal is at "L" level (active), the BRGT signal at "H" level (inactive) is output. When the ATD signal rises, and a delay time passes through the inverters 153 to 155, the BRGT signal goes to "L" level and activated.

The output from the NOR gate 157 is also input to the gate of an n-channel MOS transistor 160. The CEQ signal is also input to the gate of a p-channel MOS transistor 159, and the data line sense signal QSE is output from the node of a connection point between the drains of the transistors 159 and 160. When the ATD signal rises, and a delay time passes through the inverters 153 to 155, the data line sense signal QSE goes to "L" level to activate the data line sense amplifier (to be described later).

A write enable signal WENB is a signal which goes to "H" level in write access. The write enable signal WENB is input to a NAND gate 161 together with the ATD signal, and its output is supplied to the data buffer 18 as a BWGT signal. When the ATG signal is at "H" level (inactive), the BRGT signal at "L" level is output.

FIG. 9 shows a circuit arrangement of the data buffer (DQBF) 18. A circuit constituted by p-channel MOS transistors 179 to 181 is a data line equalizer, which is driven by the equalization signal CEQ from the DQBC circuit 17.

Also in FIG. 9, a circuit constituted by p-channel transistors 182 and 183, and n-channel transistors 184 and 185 is a data line sense amplifier, which receives the signal QSE from the data buffer control circuit 17.

A circuit constituted by NOR gates 171 and 172, p-channel MOS transistors 173 and 174, n-channel transistors 175 and 176, and inverters 177 and 178 is a latch circuit for data write access, which latches data on read/write data lines RWD and BRWD.

A circuit constituted by NOR gates 186 and 187, p-channel MOS transistors 188 and 189, n-channel transistors 190 to 193, and inverters 194 and 195 is a latch circuit for data read access, which latches data on the data lines DQ and BDQ.

Figure 10:
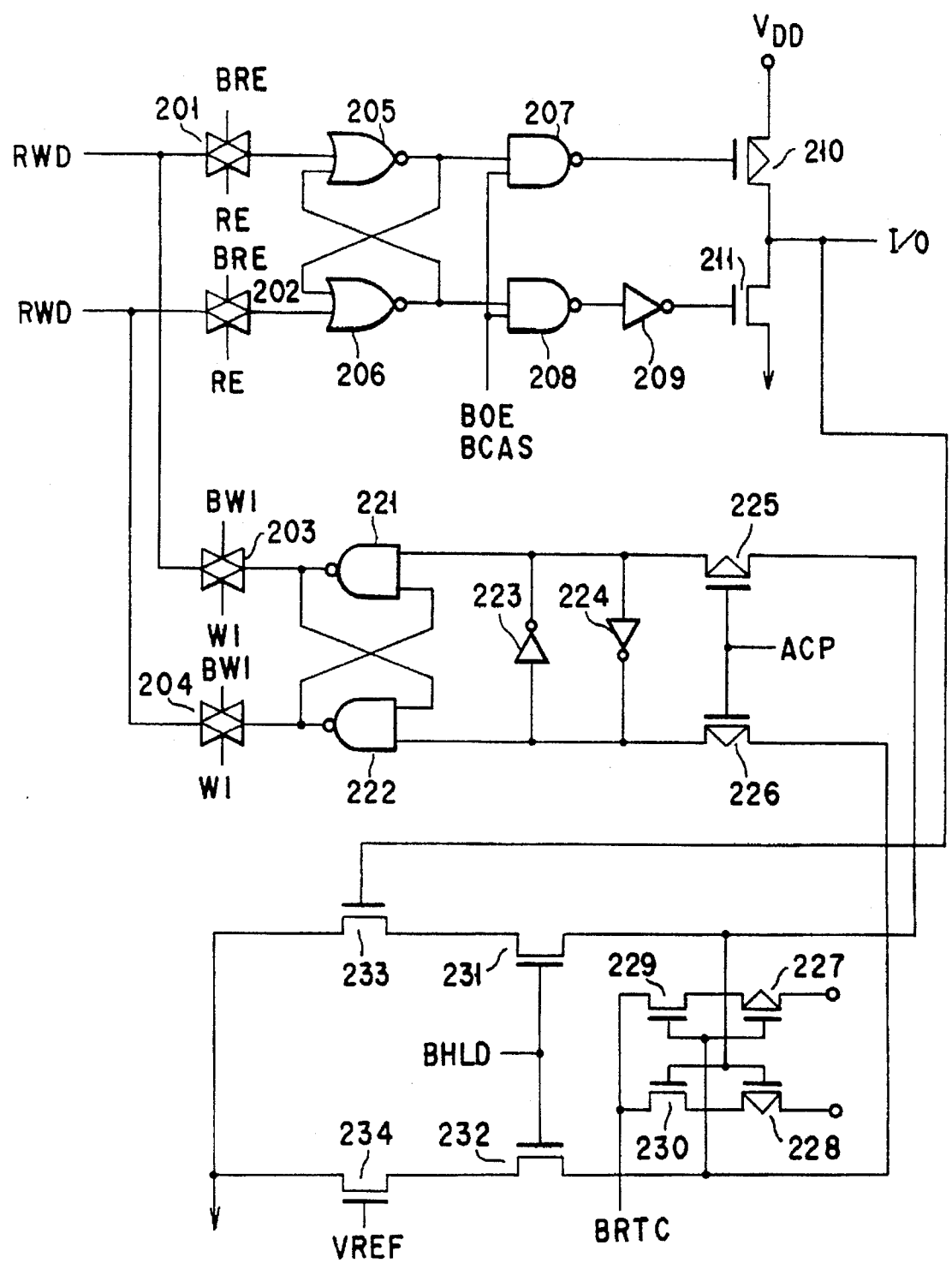
FIG. 10 is a circuit diagram showing an I/O buffer (I/O BF) according to the embodiment of the present invention.

FIG. 10 shows a circuit arrangement of the I/O buffer 19. Reference numerals 201 to 204 denote transmission gates for selecting a read portion and a write portion. Reference symbols RE and BRE denote read access control signals; and WI and BWI, write access control signals.

A circuit constituted by components 205 to 211 is a buffer for the read portion, which is controlled in accordance with an output enable signal BOE and a column address strobe signal BCAS.

A circuit constituted by components 221 to 234 is a buffer in write access. Reference symbol ACP denotes an accept signal; BRTC, a latch signal; BHLD, a hold signal; and VREF, a reference voltage.

Figure 11:
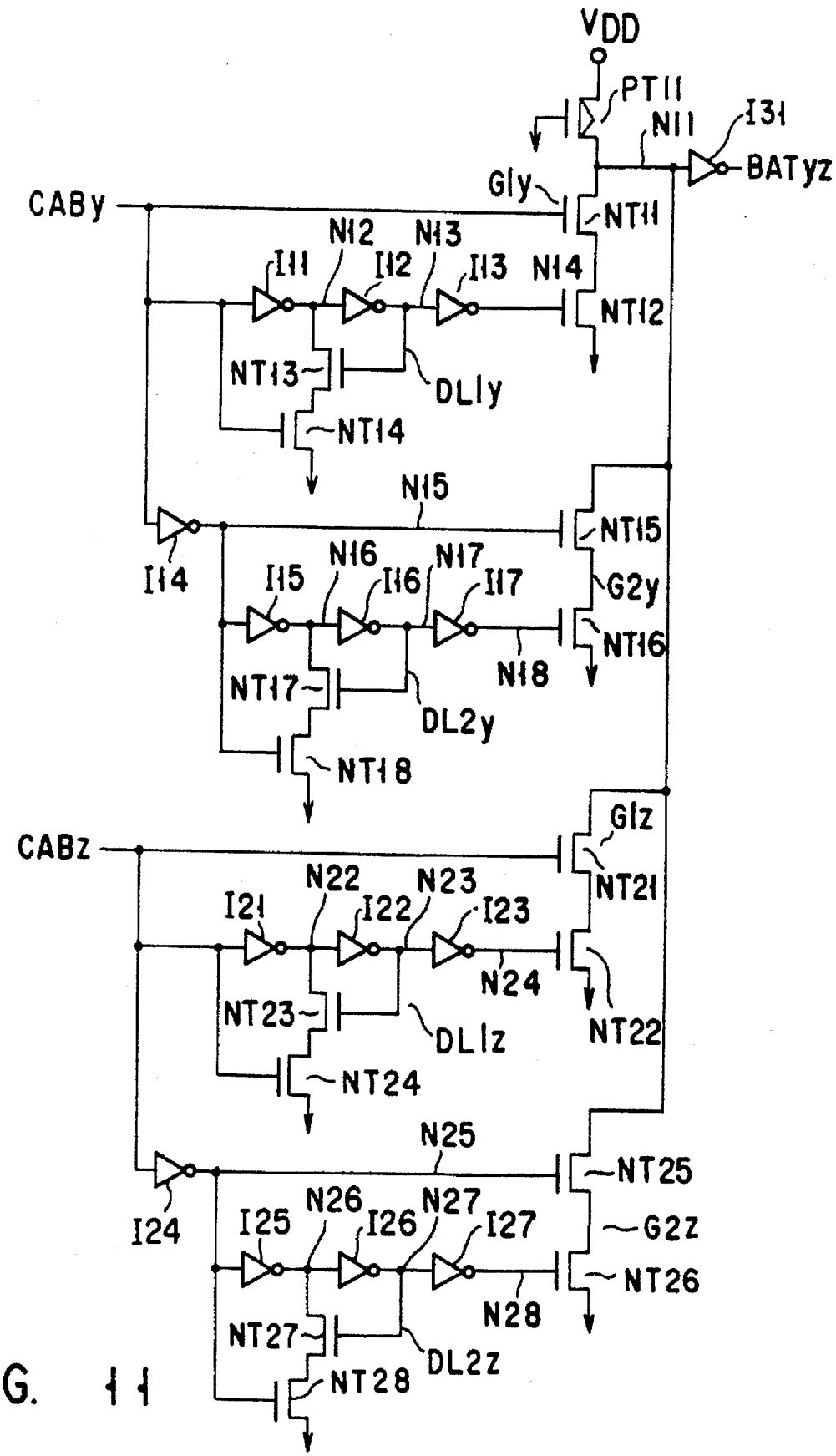
FIG. 11 is a circuit diagram showing a column address transition detector (CATD) according to the embodiment of the present invention.

The CATD circuit (column address transition detector) 15 in FIG. 2 generates the pulse signal BATyz by detecting changes in levels of the internal address signals CABy and CABz with predetermined circuit thresholds. The CATD circuit 15 has different thresholds. One threshold is used for detecting changes in internal address signals CABy and CABz from one level to the other level, and the other threshold is used for detecting changes in internal address signals CABy and CABz from the other level to one level. The arrangement will be illustrated in detail in FIG. 11.

A p-channel MOS transistor PT11 and two n-channel MOS transistors NT11 and NT12 are connected in series between the terminal of a power supply voltage VDD and a reference potential, for example, a ground level, to constitute a gate circuit G1y. That is, the drain of the p-channel MOS transistor PT11 is connected to the drain of the n-channel MOS transistor NT11 (this node (output terminal) is defined as N11), the source of the n-channel MOS transistor NT11 is connected to the drain of the n-channel MOS transistor NT12, and the source of the n-channel MOS transistor NT12 is connected to the reference potential (ground) terminal. The gate of the MOS transistor PT11 is connected to a reference potential (ground) terminal, and this MOS transistor PT11 is always set in an ON state. The internal address signal CABy output from the column input buffer 11 is input to the gate of the MOS transistor NT11.

The signal CABy is input to the gate of the MOS transistor NT12 through three cascade-connected inverters I11, I12, and I13. These three inverters I11, I12, and I13 constitute a delay circuit DL1y together with two n-channel MOS transistors NT13 and NT14. The delay circuit DL1y delays the signal CABy for a predetermined time.

The drain and source of the MOS transistor NT13 are connected to the output terminals of the inverter I11 on the first stage and the drain of the MOS transistor NT14, respectively. The source of the MOS transistor NT14 is connected to a reference potential. An output signal from the inverter I12 on the second stage is input to the gate of the MOS transistor NT13. A signal to be input to the inverter I11 on the first stage in the delay circuit DL1y, i.e., the signal CABy is input to the gate of the MOS transistor NT14.

The two MOS transistors NT13 and NT14 give predetermined hysteresis characteristics to the inverter I11. That is, when the signal CABy is "H", an output signal from the inverter I12 is also "H" to turn on both the MOS transistors NT13 and NT14. For this reason, an output signal from the inverter I11 is difficult to rise to "H". As a result, when the signal CABy falls to "L", an apparent circuit threshold of the inverter I11 becomes lower compared to a case in which the MOS transistors NT13 and NT14 are not provided. Note that the gate inputs of the MOS transistors NT13 and NT14 may be exchanged.

In addition, two n-channel MOS transistors NT15 and NT16 are inserted in series between the above node N11 and a reference potential line to constitute a gate circuit G2y. That is, the drain and source of the MOS transistor NT15 are connected to the node N11 and the drain of the MOS transistor NT16, respectively. The source of the MOS transistor NT16 is connected to the reference potential line. An output signal from an inverter I14 for inverting the signal CABy is input to the gate of the MOS transistor NT15. An output signal from the inverter I14 is input to the gate of the MOS transistor NT16 through three cascade-connected inverters I15, I16, and I17. These three inverters I15, I16, and I17 constitute a delay circuit DL2y together with two n-channel MOS transistors NT17 and NT18. The delay circuit DL2y delays the signal CABy for a predetermined time. The n-channel MOS transistors NT17 and NT18 give predetermined hysteresis characteristics to the inverter I15.

The drain and source of the MOS transistor NT17 are connected to the output terminal of the inverter I15 on the first stage and the drain of the MOS transistor NT18, respectively. The source of the MOS transistor NT18 is connected to a reference potential line.

An output signal from the inverter I16 on the second stage is input to the gate of the MOS transistor NT17. A signal to be input to the inverter I15 on the first stage in the delay circuit DL2y, i.e., an output signal from the inverter I14 is input to the gate of the other MOS transistor NT18. In this case, when the signal CABy is "L", output signals from the inverters I14 and I16 are set "H" to turn on both the MOS transistors NT17 and NT18. For this reason, an output signal from the inverter I15 is difficult to rise to "H". As a result, when the signal CABy rises to "H" (i.e., when N15 falls), an apparent circuit threshold of the inverter I15 becomes lower compared to a case in which the MOS transistors NT17 and NT18 are not provided. Also in this case, the gate inputs of the MOS transistors NT17 and NT18 may be exchanged.

This CATD circuit 15 comprises gate circuits G1z and G2z corresponding to the gate circuits G1y and G2y, delay circuits DL1z and DL2z corresponding to the delay circuits DL1y and DL2y, and an inverter I24 corresponding to the inverter I14 for the internal address signal CABz output from the column input buffer 12.

The gate circuit G1z shares the p-channel MOS transistor PT11 with the gate circuit G1y and comprises two n-channel MOS transistors NT21 and NT22, which are inserted in series between the node N11 and a reference potential terminal similar to the two n-channel MOS transistors NT11 and NT12 in the gate circuit G1y. That is, the drain and source of the n-channel MOS transistor NT21 are connected to the node N11 and the drain of the n-channel MOS transistor NT22, respectively. The source of the n-channel MOS transistor NT22 is connected to the reference potential terminal. The gate circuit G2z comprises two n-channel MOS transistors NT25 and NT26, which are inserted in series between the node N11 and a reference potential terminal similar to the two n-channel MOS transistors NT15 and NT16 in the gate circuit G2y.

The delay circuit DL1z is constituted by three cascade-connected inverters I21, I22, and I23, and two n-channel MOS transistors NT23 and NT24 for giving hysteresis characteristics to the inverter I21, like the delay circuit DL1y. The delay circuit DL2z is constituted by three cascade-connected inverters I25, I26, and I27, and two n-channel MOS transistors NT27 and NT28 for giving hysteresis characteristics to the inverter I25, like the delay circuit DL2y.

An inverter I31 for outputting the signal BATyz upon reception of a signal from the node N11 is connected to the node (output terminal) N11.

The circuit thresholds of the inverters I14 and I24 are set lower than the circuit thresholds of the gate circuits G1y and G1z, i.e., the voltage levels of the signals CABy and CABz at which the signal level of the node N11 is inverted. The circuit thresholds of the inverters I11 and I21 are set higher than the circuit thresholds of the inverters I15 and I25. The circuit thresholds of the inverters I11 and I21 are defined as Vthc1; the circuit thresholds of the gate circuits G1y and G1z, Vthc2; the circuit thresholds of the inverters I15 and I25, Vthc3; and the circuit thresholds of the inverters I14 and I24, Vthc4. These circuit thresholds satisfy relation Vthc1>Vthc2>Vthc3>Vthc4.

Further, the inverters I12 and I13, the inverters I16 and I17, the inverters I22 and I23, and the inverters I26 and I27 determine the pulse width of the pulse signal BATyz, respectively. To provide a predetermine delay time, the circuit thresholds of the inverters I12, I16, I22, and I26 are set relatively low (more specifically, ½ or less of the power supply potential), respectively. To the contrary, the circuit thresholds of the inverters I13, I17, I23, and I27 are set relatively high (more specifically, ½ or more of the power supply potential), respectively.

Note that, in this embodiment, each of the first and second delay circuits is constituted by the three inverters connected in series. However, the number is not limited to three, and it may only be odd.

Figure 12:
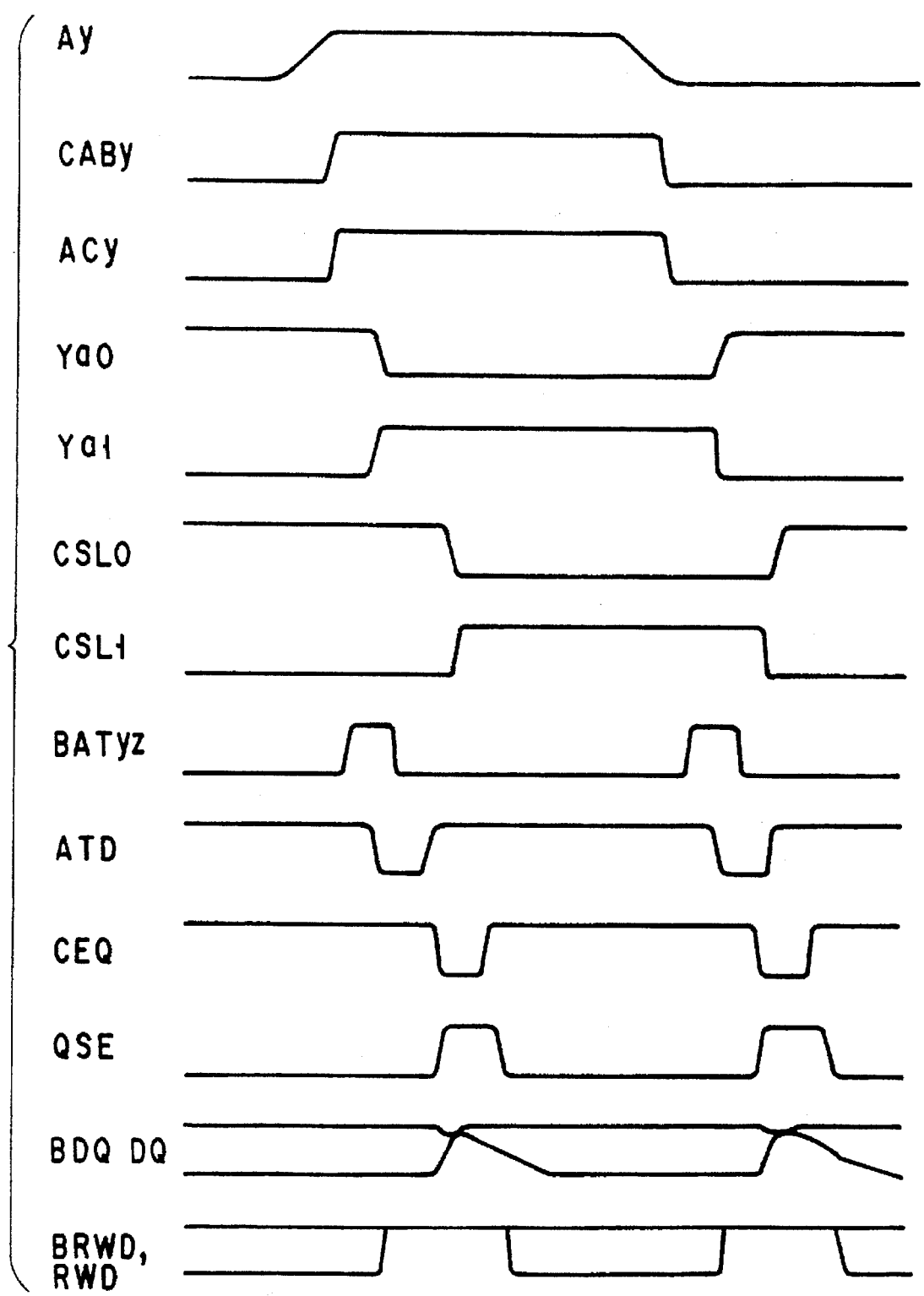
FIG. 12 is a timing chart for explaining the operation of column system circuits in one operation mode of a DRAM of the present invention.

The operation of the DRAM having the above arrangement will be described below. FIG. 12 is a timing chart for explaining the operation of the column system circuits in a fast page mode as a general operation mode of a DRAM. In this case, assume that the external address signal Ay changes from "L" to "H", and the external address signal Az is always "L". First, the signal Ay changes. Upon a change in internal address signal ACy output from the column input buffer 11, the column partial decoder 13 sets the decode signal Ya0, which has been selected, "L", and the decode signal Ya1 "H". By switching these decode signals Ya0 and Ya1, the column decoder 14 sets the column selection line CSL0, which has been selected, "L", and the column selection line CSL1 "H". The DQ gate 20 is turned on to connect the bit lines BL1 and BBL1 to the data lines DQ and BDQ. At this time, the potentials of the newly selected bit lines BL1 and BBL1 are set in accordance with a read potential from a memory cell selected by a word line in advance.

Upon a change in internal address signal CABy output from the column input buffer 11, the CATD circuit 15 outputs the pulse signal BATyz to the ATDG circuit 16. The ATDG circuit 16 receives the pulse signals BATwx and BATuv generated from other external address signals in addition to the pulse signal BATyz to output the pulse signal ATD. That is, the ATDG circuit 16 outputs the pulse signal ATD when at least one of the external address signals changes in level regardless of the direction of the level change in address signal and the number of signals to be detected. The pulse signal ATD is input to all the DQBCs 17 in a memory chip. One of these DQBCs 17 is selectively activated by the row address signal, and the activated DQBC 17 outputs the data line equalization signal CEQ and the data line sense signal QSE to the corresponding data buffer 18.

Upon reception of the data line equalization signal CEQ, the data buffer 18 performs an equalization operation for the corresponding pair of data lines DQ and BDQ. During this operation, the column decoder 14 performs selective switching control of the column selection lines, as described above. As shown in FIG. 12, the column selection line CSL1 is set "H" to connect the bit lines BL1 and BBL1 to the data lines DQ and BDQ, and the data line connected to, e.g., the bit line corresponding to an "L"-side potential is decreased from "H" to "L". The data line equalization signal CEQ goes to "H". Upon completion of the equalization operation, the data buffer 18 receives the data line sense signal QSE to perform a data sense operation on the data lines DQ and BDQ, which have a potential difference to a certain degree.

Thereafter, the sensed data is transferred to the read/write data line RWD/BRWD which is precharged to "H" in advance on the basis of the pulse signal ATD. The input/output buffer 19 receives the transferred data and outputs it as an external output in accordance with the states of a column address strobe signal ($\overline{CAS}$) and an output enable signal ($\overline{OE}$).

The same operation is performed when the external address signal Ay changes from "H" to "L". The selection state of the column selection line is switched upon a change in address signal, and the data buffer 18 remains unchanged.

The operation of the CATD circuit 15 for outputting the pulse signal BATyz will be described. FIG. 13 is a timing chart in a normal operation mode when noise is not generated in the column input buffers 11 and 12. A case will be described in which the signal CABy changes from "L" to "H" and subsequently from "H" to "L", and the signal CABz is fixed to "L".

First, the signal CABy changes from "L" to "H". At this time, both the MOS transistors NT11 and NT12 in the gate circuit G1y are turned on, and the node N11 tends to be "L" because an output node N14 of the inverter I13 in the delay circuit DL1y has been "H". However, the MOS transistor PT11 is always turned on, and the node N11 is continuously charged by the power supply voltage VDD, so that the potential of the node N11 is decreased to a potential determined by a ratio of the channel widths of the MOS transistors PT11, NT11, and NT12. With the elapse of time corresponding to a delay time of three stages of the inverters in the delay circuit DL1y, the output node N14 of the inverter I13 becomes "L" to turn off the MOS transistor NT12. With this operation, the potential of the node N11 increases to the power supply voltage VDD. The inverter I31 is connected to the node N11, and its output becomes "H" when the potential of the node N11 is the circuit threshold of the inverter I31 or less. For this reason, the inverter I31 outputs the pulse signal BATyz obtained by shaping the potential waveform of the node N11 in synchronization with the leading edge of the signal CABy.

Next, the signal CABy changes from "H" to "L". Since an output node N18 of the inverter I17 in the delay circuit DL2y is "H" in advance, the MOS transistor NT16 in the gate circuit G2y is kept on. When the signal CABy changes from "H" to "L", and the output node N15 of the inverter I14 is changed to "H", both the MOS transistors NT15 and NT16 in the gate circuit G2y are turned on, and the node N11 tends to be "L". Owing to the same reason as described above, the potential of the node N11 is decreased to a potential determined by a ratio of the channel widths of the MOS transistors PT11, NT15, and NT16. With the elapse of time corresponding to a delay time of three stages of the inverters in the delay circuit DL2y, the output node N18 of the inverter I17 becomes "L" to turn off the MOS transistor NT16. With this operation, the potential of the node N11 increases to the power supply voltage VDD. Also in this case, when the potential of the node N11 is the circuit threshold of the inverter I31 or less, the output from the inverter I31 becomes "H". For this reason, the inverter I31 outputs the pulse signal BATyz in synchronization with the trailing edge of the signal CABy.

Figure 14:
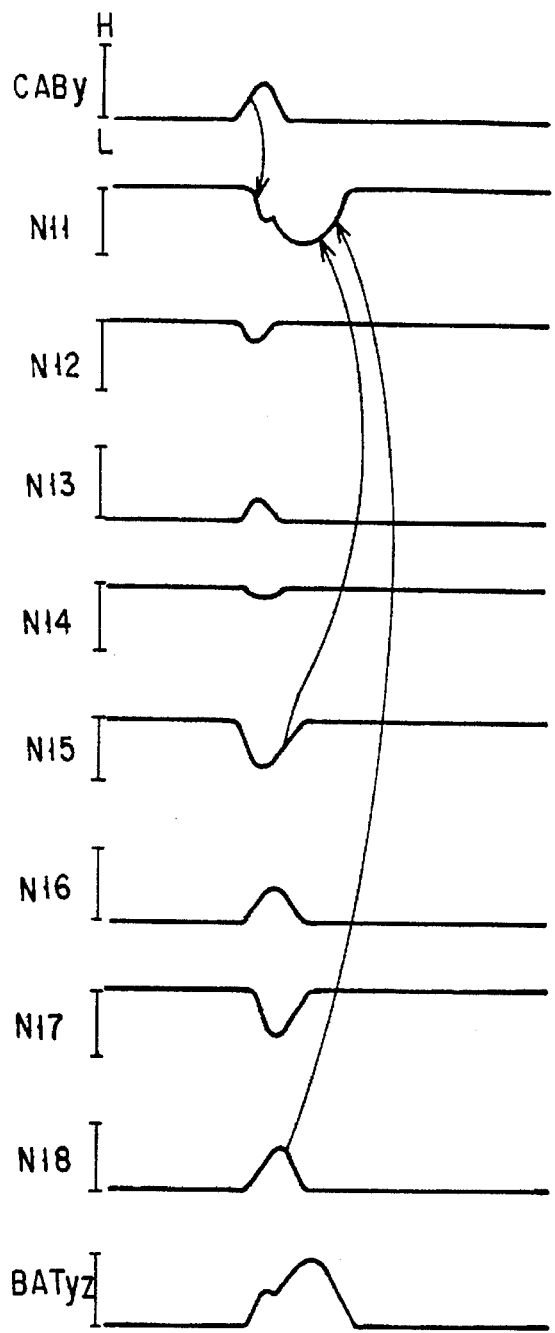
FIG. 14 is a timing chart for explaining an operation when an output signal from the column input buffer is "L", and "H" noise is generated in the DRAM of the present invention.

FIG. 14 is a timing chart when the output signal CABy from the column input buffer 11 is "L", and "H" noise is generated. Upon reception of the leading edge of this noise, both the MOS transistors NT11 and NT12 are turned on to decrease the potential of the node N11. Since the circuit threshold of the inverter I11 is set high, the inverter I11 operates in a direction of canceling the noise, thereby suppressing the noise on an output node N12 of the inverter I11. Since the circuit threshold of the inverter I12 on the stage next to the inverter I11 is low, and the circuit threshold of the inverter I13 on the stage next to the inverter I12 is high, the noise is suppressed according to the subsequent stages, i.e., the nodes N13 and N14.

On the other hand, since the circuit threshold of the inserter I14 is set lower than that of the gate circuit G1y, the noise is sufficiently amplified and output to the output node N15. Since the circuit threshold of the inverter I15 in the delay circuit DL2Y is set low, the noise is suppressed on an output node N16. However, since the circuit threshold of the inverter I16 on the next stage is low, and the circuit threshold of the inverter I17 on the stage next to the inverter I16 is high, the noise is amplified according to the subsequent stages, i.e., the nodes N16 and N17. That is, noise sufficiently amplified appears on the nodes N15 and N18 as gate signals of the two MOS transistors NT15 and NT16, which constitute the gate circuit G2y. For this reason, the potential of the node N11, which will start to increase, is decreased again due to this noise to prolong a period in which the potential of the node N11 is lower than the circuit threshold of the inverter I31. As a result, the inverter I31 outputs the pulse signal BATyz. Even when the signal CABz is "L", and "H" noise is generated, the pulse signal BATyz is similarly output.

Note that, when the noise of the signal CABy or CABz does not exceed the circuit threshold of the gate circuit G1y or G1z, i.e., when the noise does not affect the potential of the node N11 to invert an output from the inverter I14 or I24, the noise can be absorbed in the delay circuit DL1y or DL1z by sufficiently decreasing the threshold of the inverter I11 or I21 to be lower than the circuit threshold of the gate circuit G1y or G1z. This is achieved by adding a hysteresis MOS transistor to the inverter I14 or I24 to decrease its apparent threshold. With this arrangement, it can be prevented to output the pulse signal BATyz in accordance with the trailing edge of the second half portion of the noise waveform.

Figure 15:
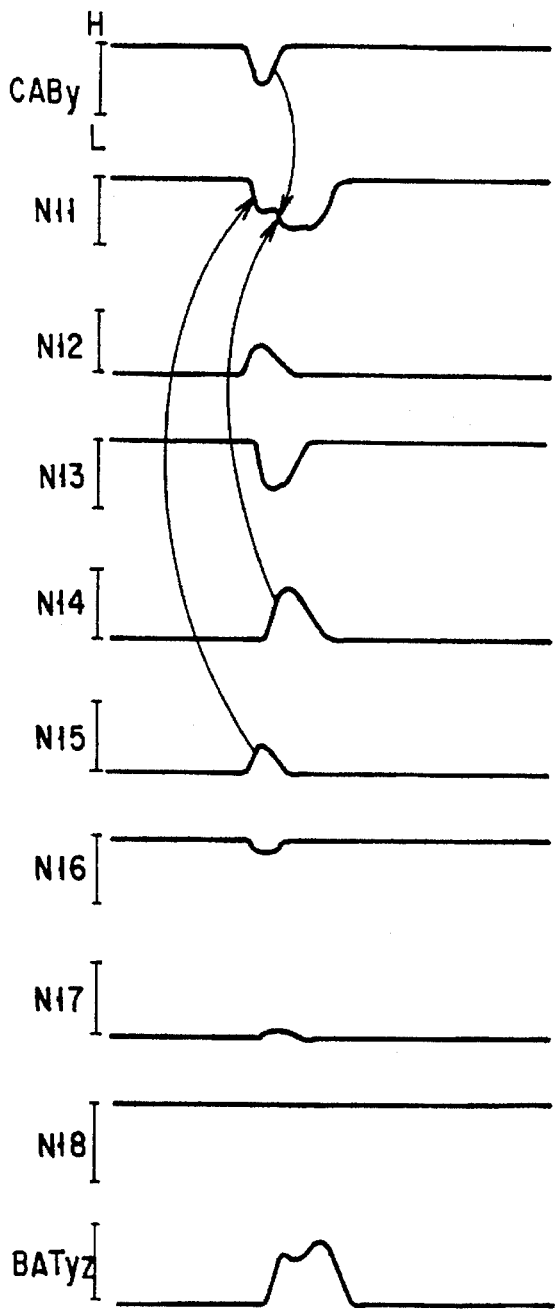
FIG. 15 is a timing chart for explaining an operation when an output signal CABy from the column input buffer is "H", and "L" noise is generated in the DRAM of the present invention.

FIG. 15 is a timing chart when the output signal CABy from the column input buffer 11 is "H", and "L" noise is generated. At this time, an operation reverse to that in FIG. 14 is performed. The concept of noise is the same, and noise generation causes the inverter I31 to output the pulse signal BATyz, as shown in FIG. 14. In addition, even when the signal CABz is "L" while "H" noise is generated, the pulse signal BATyz is output in a similar manner.

Also in this case, when the noise of the signal CABy or CABz does not exceed the circuit threshold of the gate circuit G1y or G1z, i.e., when the noise does not affect the potential of the node N11 to invert an output from the inverter I14 or I24, the noise can be absorbed in the delay circuit DL1y or DL1z by sufficiently decreasing the threshold of the inverter I11 or I21 to be lower than the circuit threshold of the gate circuit G1y or G1z. This is achieved by adding a hysteresis MOS transistor to the inverter I14 or I24 to decrease its apparent threshold. With this arrangement, it can be prevented to output the pulse signal BATyz in accordance with the trailing edge of the second half portion of the noise waveform.

As described above, when noise having a certain degree is generated in the column input buffer, the CATD 15 outputs the pulse signal BATyz. Consider a case in which the column selection lines are switched with the noise in the conventional manner. That is, when the column selection line SCL0, which has been in a non-selected state, is selected upon noise generation, and the column selection line CSL1, which has been in a selected state, is set to a non-selected state, the pair of bit lines BL0 and BBL0 are connected to the data lines DQ and BDQ instead of the pair of bit lines BL1 and BBL1. At this time, since the CATD 15 outputs the pulse signal BATyz on the basis of the noise, the ATDG circuit 16 also outputs the pulse signal ATD. Therefore, the DQBC circuit 17 and the data buffer 18 are operated with the noise to perform an equalization operation of the data lines DQ and BDQ and a sense operation of the data. The data lines DQ and BDQ are reset to have a potential relationship corresponding to the potential of the pair of the bit lines BL0 and BBL0 which is switched by the noise. For this reason, it can be prevented to reverse a potential relationship of the pair of the bit lines BL0 and BBL0 and destroy storage data of a memory cell erroneously selected by noise, unlike in the conventional DRAM.

As has been described above, according to the present invention, there can be provided a semiconductor memory having high reliability, in which cell data is not destroyed in noise generation.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory comprising:
   a plurality of memory cells arranged in rows and columns;
   a plurality of bit lines connected to said plurality of memory cells in a direction of the columns;
   a plurality of switch means, each switch means having one end connected to a corresponding one of said plurality of bit lines, said plurality of switch means being selectively turned on in accordance with a column address signal to designate at least one selected column;
   a data line to which the other end of each of said plurality of switch means is commonly connected;
   pulse generation means, having a first threshold voltage level and a second threshold voltage level different from the first threshold voltage level, for detecting a change in voltage level of the column address signal using the first and the second threshold voltage levels, said pulse generation means operating to generate a pulse signal when a change is detected,
   the first threshold voltage level being used for detecting a change in the column address signal from one of low level and high level to the other level, and
   the second threshold voltage level being used for detecting a change in the column address signal from the other level to the one level; and
   data detection means, connected to said data line and controlled in accordance with the pulse signal generated by said pulse generation means, for amplifying a potential of said data line to detect data,
   wherein said pulse generation means includes a first circuit having the first threshold voltage level and a second circuit having the second threshold voltage level,
   said first circuit includes:
   a first delay circuit for delaying the column address signal to output a signal having a level complementary to the column address signal;
   a first gate circuit connected between a line of a power supply potential and a reference potential line, said first gate circuit including
   a p-channel MOS transistor having a first drain region connected to said line of the power supply potential, a first source region connected to a first output terminal, and a first gate electrode,
   a first n-channel MOS transistor having a second drain region connected to said first output terminal, a second source region, and a second gate electrode to which the column address signal is supplied, and
   a second n-channel MOS transistor having a third drain region connected to said second source region of said first n-channel MOS transistor, a third source region connected to said reference potential line, and a third gate electrode to which the output signal from said first delay circuit is supplied, and
   said second circuit includes:
   a first inversion circuit, having a threshold voltage level lower than a threshold voltage level of said first gate circuit, for receiving the column address signal to invert the column address signal;
   a second delay circuit for delaying an output signal from said first inversion circuit to output a signal having a level complementary to the output signal from said first inversion circuit; and
   a second gate circuit connected between said first output terminal and said reference potential line, said second gate circuit including:
   a third n-channel MOS transistor having a fourth drain region connected to said first output terminal, a fourth source region, and a fourth gate electrode to which the output signal from said first is inversion circuit is supplied, and
   a fourth n-channel MOS transistor having a fifth drain region connected to said fourth source region of said third n-channel MOS transistor, a fifth source region connected to said reference potential line, and a fifth gate electrode to which the output signal from said second delay circuit is supplied.

2. A memory according to claim 1, wherein said pulse generation means further includes a waveform shaping circuit connected to said first output terminal for outputting a shaped waveform to a second output terminal.

3. A memory according to claim 2, wherein a second inversion circuit is used for said waveform shaping circuit.

4. A memory according to claim 1, wherein said first delay circuit includes an odd number of multistage-connected third inversion circuits, and said second delay circuit includes an odd number of multistage-connected fourth inversion circuits.

5. A memory according to claim 4, wherein said first delay circuit further includes:
   a fifth n-channel MOS transistor and a sixth n-channel MOS transistor,
      said fifth n-channel MOS transistor having a sixth drain region connected to a second output terminal of said inversion circuit on a first stage of said odd number of multistage-connected inversion circuits, a sixth source region, and a sixth gate electrode, and
      said sixth n-channel MOS transistor having a seventh drain region connected to said sixth source region of said fifth n-channel MOS transistor, a seventh source region connected to said reference potential line, and a seventh gate electrode; and
   the column address signal to be input to the first stage of said odd number of third inversion circuits multistage-connected is supplied to one of said sixth gate electrode and said seventh gate electrode, and an output signal from said inversion circuit on a second stage of said third inversion circuits is supplied to the other one of said sixth gate electrode and said seventh gate electrode.

6. A memory according to claim 4, wherein said second delay circuit further includes:
   a seventh n-channel MOS transistor and an eighth n-channel MOS transistor,
      said seventh n-channel MOS transistor having an eighth drain region connected to a third output terminal of said inversion circuit on a first stage of said odd number of multistage-connected fourth inversion circuits, an eighth source region, and an eighth gate electrode, and
      said eighth n-channel MOS transistor having a ninth drain region connected to said eighth source region of said seventh n-channel MOS transistor, a ninth source region connected to said reference potential line, and a ninth gate electrode; and
   an output signal from said first inversion circuit to be input to the first stage of said odd number of multistage-connected fourth inversion circuits is supplied to one of said eighth gate electrode and said ninth gate electrode, and an output signal from said inversion circuit on a second stage of said fourth inversion circuits is supplied to the other one of said eighth gate electrode and said ninth gate electrode.

7. A memory according to claim 1, wherein said first delay circuit includes third three inversion circuits multistage-connected, and said second delay circuit includes fourth three inversion circuits multistage-connected.

8. A memory according to claim 7, wherein said first delay circuit further includes:
   a fifth n-channel MOS transistor and a sixth n-channel MOS transistor,
      said fifth n-channel MOS transistor having a sixth drain region connected to a second output terminal of said inversion circuit on a first stage of said three multistage-connected third inversion circuits, a sixth source region, and a sixth gate electrode, and
      said sixth n-channel MOS transistor having a seventh drain region connected to said sixth source region of said fifth n-channel MOS transistor, a seventh source region connected to said reference potential line, and a seventh gate electrode; and
   the column address signal to be input to said inversion circuit on the first stage of said three multistage-connected third inversion circuits is supplied to one of said sixth gate electrode and said seventh gate electrode, and an output signal from said inversion circuit on a second stage of said third inversion circuits is supplied to the other one of said sixth gate electrode and said seventh gate electrode.

9. A memory according to claim 7, wherein said second delay circuit further includes:
   a seventh n-channel MOS transistor and an eighth n-channel MOS transistor,
      said seventh n-channel MOS transistor having an eighth drain region connected to a third output terminal of said inversion circuit on a first stage of said three multistage-connected fourth inversion circuits, an eighth source region, and an eighth gate electrode, and
      said eighth n-channel MOS transistor having a ninth drain region connected to said eighth source region of said seventh n-channel MOS transistor, a ninth source region connected to said reference potential line, and a ninth gate electrode; and
   an output signal from said first inversion circuit to be input to said inversion circuit on the first stage of said three multistage-connected fourth inversion circuits is supplied to one of said eighth gate electrode and said ninth gate electrode, and an output signal from said inversion circuit on a second stage of said fourth inversion circuits is supplied to the other one of said eighth gate electrode and said ninth gate electrode.

10. A memory according to claim 7, wherein a threshold voltage level of said inversion circuit on a first stage of said fourth inversion circuits in said second delay circuit is lower than a threshold voltage level of said inversion circuit on a first stage of said third inversion circuits in said first delay circuit.

11. A memory according to claim 7, wherein, in said first delay circuit, a threshold voltage level of said inversion circuit on a second stage of said multistage-connected third inversion circuits is not more than ½ of the power supply potential, and a threshold voltage level of said inversion circuit on a third stage is not less than ½ of the power supply potential.

12. A memory according to claim 7, wherein, in said second delay circuit, a threshold voltage level of said inversion circuit on a second stage of said multistage-connected fourth inversion circuits is not more than ½ of the power supply potential, and a threshold voltage level of said inversion circuit on a third stage is not less than ½ of the power supply potential.

13. A memory according to claim 7, wherein, when a threshold voltage level of said inversion circuit on a first stage of said third inversion circuits is defined as Vthc1, a threshold voltage level of said first gate circuit is defined as Vthc2, a threshold voltage level of said inversion circuit on a first stage of said fourth inversion circuits is defined as Vthc3, and a threshold voltage level of said first inversion circuit is defined as Vthc4, a relationship represented by $$Vthc1 > Vthc2 > Vthc3 > Vthc4$$

is satisfied.

14. A pulse generating circuit comprising:
   a first delay circuit for delaying an input signal to output a signal having a level complementary to the input signal;

a first gate circuit connected between a line of a power supply potential and a reference potential line, said first gate circuit including:
- a p-channel MOS transistor having a first drain region connected to said line of the power potential, a first source region connected to a first output terminal, and a first gate electrode,
- a first n-channel MOS transistor having a second drain region connected to said first output terminal, a second source region, and a second gate electrode to which the input signal is supplied, and
- a second n-channel MOS transistor having a third drain region connected to said second source region of said first n-channel MOS transistor, a third source region connected to said reference potential line, and a third gate electrode to which the output signal from said first delay circuit is supplied;

a first inversion circuit, having a threshold voltage level lower than a threshold voltage level of said first gate circuit, for receiving the input signal to invert the input signal;

a second delay circuit for delaying an output signal from said first inversion circuit to output a signal having a level complementary to the output signal from said first inversion circuit;

a second gate circuit connected between said first output terminal and said reference potential line, said second gate circuit including:
- a third a-channel MOS transistor having a fourth drain region connected to said first output terminal, a fourth source region, and a fourth gate electrode to which the output signal from said first inversion circuit is supplied, and
- a fourth n-channel MOS transistor having a fifth drain region connected to said fourth source region of said third n-channel MOS transistor, a fifth source region connected to said reference potential line, and a fifth gate electrode to which the output signal from said second delay circuit is supplied; and a second inversion circuit connected between the first output terminal and a second output terminal, wherein said first delay circuit includes third three inversion circuits multistage-connected, and said second delay circuit includes fourth three inversion circuits multistage-connected, said first delay circuit further includes a fifth n-channel MOS transistor and a sixth n-channel MOS transistor, said fifth n-channel MOS transistor having a sixth drain region connected to a second output terminal of said inversion circuit on a first stage of said three multistage-connected third inversion circuits, a sixth source region, and a sixth gate electrode, and said sixth n-channel MOS transistor having a seventh drain region connected to said sixth source region of said fifth n-channel MOS transistor, a seventh source region connected to said reference potential line, and a seventh gate electrodes, the input signal to be input to said inversion circuit on the first stage of said three multistage-connected third inversion circuits is supplied to one of said sixth gate electrode and said seventh gate electrode, and an output signal from said inversion circuit on a second stage of said third inversion circuits is supplied to the other one of said sixth gate electrode and said seventh gate electrode, said second delay circuit further includes a seventh n-channel MOS transistor and an eighth n-channel MOS transistor, said seventh n-channel MOS transistor having an eighth drain region connected to a third output terminal of said inversion circuit on a first stage of said three multistage-connected fourth inversion circuits, an eighth source region, and an eighth gate electrode, and said eighth n-channel MOS transistor having a ninth drain region connected to said eighth source region of said seventh n-channel MOS transistor, a ninth source region connected to said reference potential line, and a ninth gate electrode, and an output signal from said first inversion circuit to be input to said inversion circuit on the first stage of said three multistage-connected fourth inversion circuits is supplied to one of said eighth gate electrode and said ninth gate electrode, and an output signal from said inversion circuit on a second stage of said fourth inversion circuits is supplied to the other one of said eighth gate electrode and said ninth gate electrode.

15. A pulse generating circuit according to claim 14, wherein, when a threshold voltage level of said inversion circuit on a first stage of said third inversion circuits is defined as Vthc1, a threshold voltage level of said first gate circuit is defined as Vthc2, a threshold voltage level of said inversion circuit on a first stage of said fourth inversion circuits is defined as Vthc3, and a threshold voltage level of said first inversion circuit is defined as Vthc4, a relationship represented by $$Vthc1 > Vthc2 > Vthc3 > Vthc4$$

is satisfied.

* * * * *